United States Patent [19]
Sato

[11] Patent Number: 5,122,677
[45] Date of Patent: Jun. 16, 1992

[54] INSTANTANEOUS BREAKLESS CLOCK SWITCHING APPARATUS

[75] Inventor: Sakutaro Sato, Kawasaki, Japan

[73] Assignee: Fujitsu Limited, Kanagawa, Japan

[21] Appl. No.: 754,401

[22] Filed: Sep. 3, 1991

[30] Foreign Application Priority Data

Sep. 4, 1990 [JP] Japan .................................. 2-233684

[51] Int. Cl.⁵ ...................... H03L 7/00; H03K 17/00; H03K 5/13; H03B 00/00
[52] U.S. Cl. .................................... 307/269; 307/511; 328/63; 328/155; 328/72; 328/104; 328/137; 328/154; 331/49
[58] Field of Search ..................... 328/155, 55, 63, 72, 328/104, 137, 154; 307/269, 511; 370/82, 84, 105; 331/49, 11

[56] References Cited

U.S. PATENT DOCUMENTS 4,860,283 8/1989 Takano et al. ..................... 370/82

Primary Examiner—Stanley D. Miller
Assistant Examiner—Trong Phan
Attorney, Agent, or Firm—Helfgott & Karas

[57] ABSTRACT

A clock switching apparatus includes a first phase synchronizing part for receiving n (n is an integer) input clock signals and for generating n first clock signals respectively related to the n input clock signals. Each of the n first clock signals has a frequency higher than that of a corresponding one of the n input clock signals. A selector selects one of the n first clock signals. A frequency divider generates a second clock signal obtained by frequency-dividing the one of the n first clock signals selected by the selector. A second phase synchronizing part generates an output clock signal synchronized with the second clock signal.

10 Claims, 6 Drawing Sheets 5,122,677

INSTANTANEOUS BREAKLESS CLOCK SWITCHING APPARATUS

BACKGROUND OF THE INVENTION (1) Field of the Invention

The present invention generally relates to a clock switching apparatus, and more particularly to a clock switching apparatus selecting a clock signal from a plurality of clock signals without a signal break.

(2) Description of the Prior Art

In recent communication systems, a plurality of clock sources, generating clock signals, are provided and one of the clock sources is selected in order to establish the synchronization of the entire communication system and improve the reliability thereof. Examples of such clocks for use in system synchronization are a master clock generated and output by an exchange office, an internal clock generated in each terminal, and a clock extracted from a signal transmitted from a transmission line.

FIG. 1 shows a conventional clock switching apparatus. As shown, the clock switching apparatus is made up of two frequency dividers 10-1 and 10-2, a selector 12, a phase synchronizing circuit 13 and a differentiating circuit 14. The clock switching apparatus shown in FIG. 1 receives two identical master clock signals CLKa and CLKb from an exchange office (not shown), and selects either the clock signal CLKa or CLKb. Each of the identical master clock signals CLKa and CLKb, which are also illustrated in FIG. 2, has a frequency of, for example, 1.5 MHz. The frequency dividers 10-1 and 10-2 frequency-divide the clock signals CLKa and CLKb, respectively, and output respective frequency-divided clock signals DCLKa and DCLKb shown in FIG. 2 to the selector 12. Each of the frequency-divided clock signals DCLKa and DCLKb has a frequency of, for example, 8 kHz. Normally, the selector 12 selects, for example, the clock signal CLKa.

Signal-break detection signals DETa and DETb are supplied to the selector 12. The signal-break detection signals DETa and DETb switch to an active level when the clock signals CLKa and CLKb are broken. The selected clock signal is input to the phase synchronizing 13 and the differentiating circuit 14. The phase synchronizing circuit 13 compares the phase of the selected clock signal with the phase of an output clock signal which is output to a circuit of the next stage, and synchronizes the output clock signal with the selected clock signal. The differentiating circuit 14 detects a switching point at which the selected clock signal is changed, and outputs a reset signal R to the frequency dividers 10-1 and 10-2. In response to the reset signal R, the frequency dividers 10-1 and 10-2 are reset, so that they are synchronized with each other.

Assuming that the clock signal CLKa is broken at time $t_1$, as shown in (C) and (D) of FIG. 2, the selected clock signal from the selector 12, labeled SEL, shown in (F) of FIG. 2 is broken. It will be noted that it is necessary to provide for a predetermined period of time T (equal to, for example, 10 ms) in order to detect the break of the clock signal DETa. Thus, as shown in (G) of FIG. 2, the detection signal DETa related to the clock signal CLKa switches to the active (high) level after the period T from time $t_1$. In response to this change in the detection signal DETa, the selector 12 switches to the frequency divider 10-2, so that the supply of the clock signal is restarted, as shown in (F) of FIG. 2.

It should be noted that the input terminal of the phase synchronizing circuit 13 is continuously supplied with the low-level signal (or high-level signal) during the period T. Thus, the phase of the output clock signal generated and output by the phase synchronizing circuit 13 changes abruptly. This abrupt change in the phase of the output clock signal causes various problems, such as line circuit errors and decision errors.

SUMMARY OF THE INVENTION

It is a general object of the present invention to provide an improved clock switching apparatus in which the above-mentioned disadvantage is eliminated.

A more specific object of the present invention is to provide a clock switching apparatus in which the switching of the clock signal is continuously carried out without a signal break and in which phase variations in the output clock signal are effectively suppressed.

The above-mentioned objects of the present invention are achieved by a clock switching apparatus comprising:

first phase synchronizing means for receiving n (n is an integer) input clock signals and for generating n first clock signals respectively related to the n input clock signals, each of the n first clock signals having a frequency higher than that of a corresponding one of the n input clock signals;

selector means, coupled to the first phase synchronizing means, for selecting one of the n first clock signals;

first frequency dividing means, coupled to the selector means, for generating a second clock signal obtained by frequency-dividing the one of the n first clock signals selected by the selector means; and second phase synchronizing means, coupled to the first frequency dividing means, for generating an output clock signal synchronized with the second clock signal.

BRIEF DESCRIPTION OF THE DRAWINGS

The above-mentioned objects of the present invention will become more apparent from the following detailed description when read in conjunction with the accompanying drawings, in which.

DESCRIPTION OF THE PREFERRED EMBODIMENT

Figure 3:
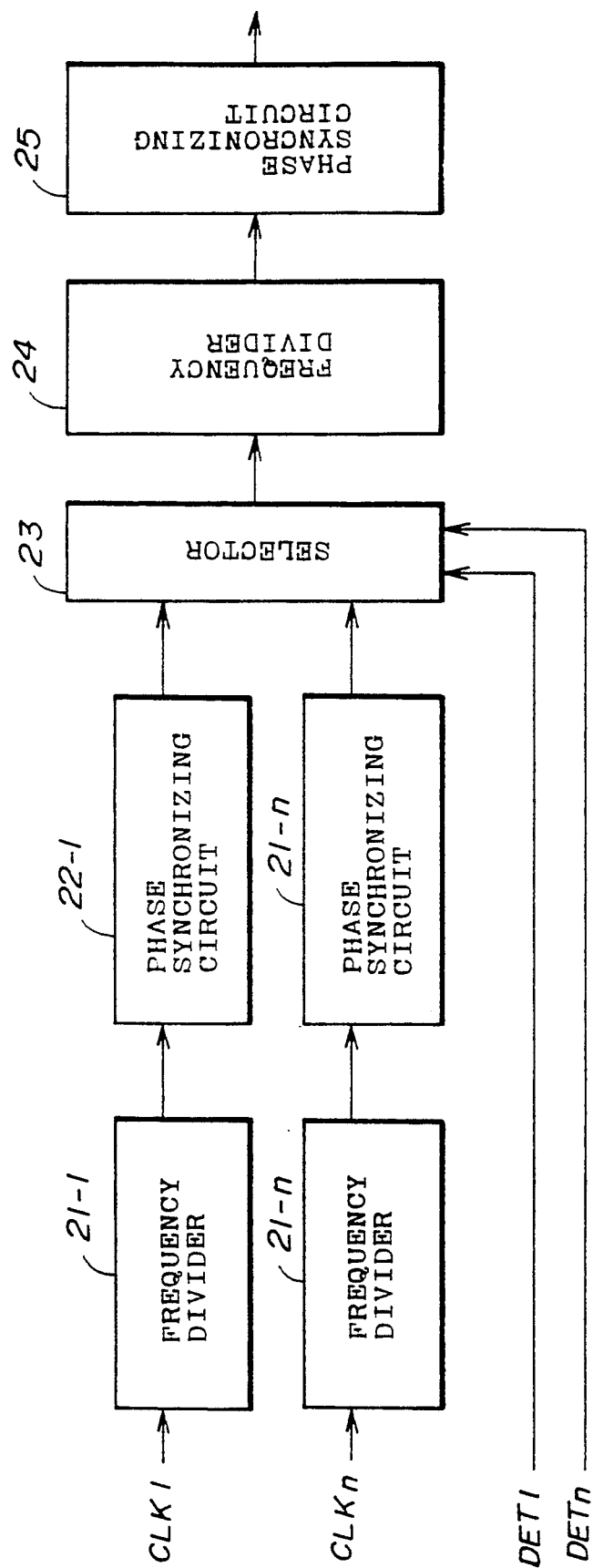
FIG. 3 is a block diagram showing an outline of a clock switching apparatus of the present invention.

FIG. 3 shows the outline of the clock switching apparatus of the present invention. The apparatus shown in FIG. 3 is composed of n frequency dividers 21-1–21-n (n is an integer), n phase synchronizing circuits 22-1–22- n, a selector 23, a frequency divider 24, and a phase synchronizing circuit 25. Clock signals CLK1–CLKn are input to the frequency dividers 21-1–21-n, respectively. Frequency-divided clock signals output by the frequency dividers 21-1–21-n are respectively input to the phase synchronizing circuits 22-1–22-n, which have respective clock generators, each generating a clock signal having a frequency higher than (for example, 100 times higher than) that of the corresponding frequency-divided clock signal. Each of the phase synchronizing circuits 22-1–22-n synchronizes the phase of the clock signal generated therein with the phase of the corresponding frequency-divided signal.

The clock signals generated by the phase synchronizing circuits 22-1–22-n and synchronized with the frequency-divided clock signals (and thus clock signals CLK1–CLKn) are input to the selector 23, which receives detection signals DET1–DETn related to the clock signals CLK1–CLKn, respectively. Normally, the selector 23 selects a predetermined one of the clock signals generated and output by the phase synchronizing circuits 22-1–22-n. When the selected clock signal is broken, the selector 23 selects another clock signal.

The selected clock signal is frequency-divided by the frequency divider 24. A frequency-divided clock signal output by the frequency divider 24 is input to the phase synchronizing circuit 25, which includes a clock generator generating an output clock signal. The phase synchronizing circuit 25 synchronizes the phase of the output clock signal with that of the frequency-divided clock signal, and outputs a phase-adjusted output clock signal (synchronized with the selected clock signal) to a circuit of the next stage (not shown).

Figure 1:
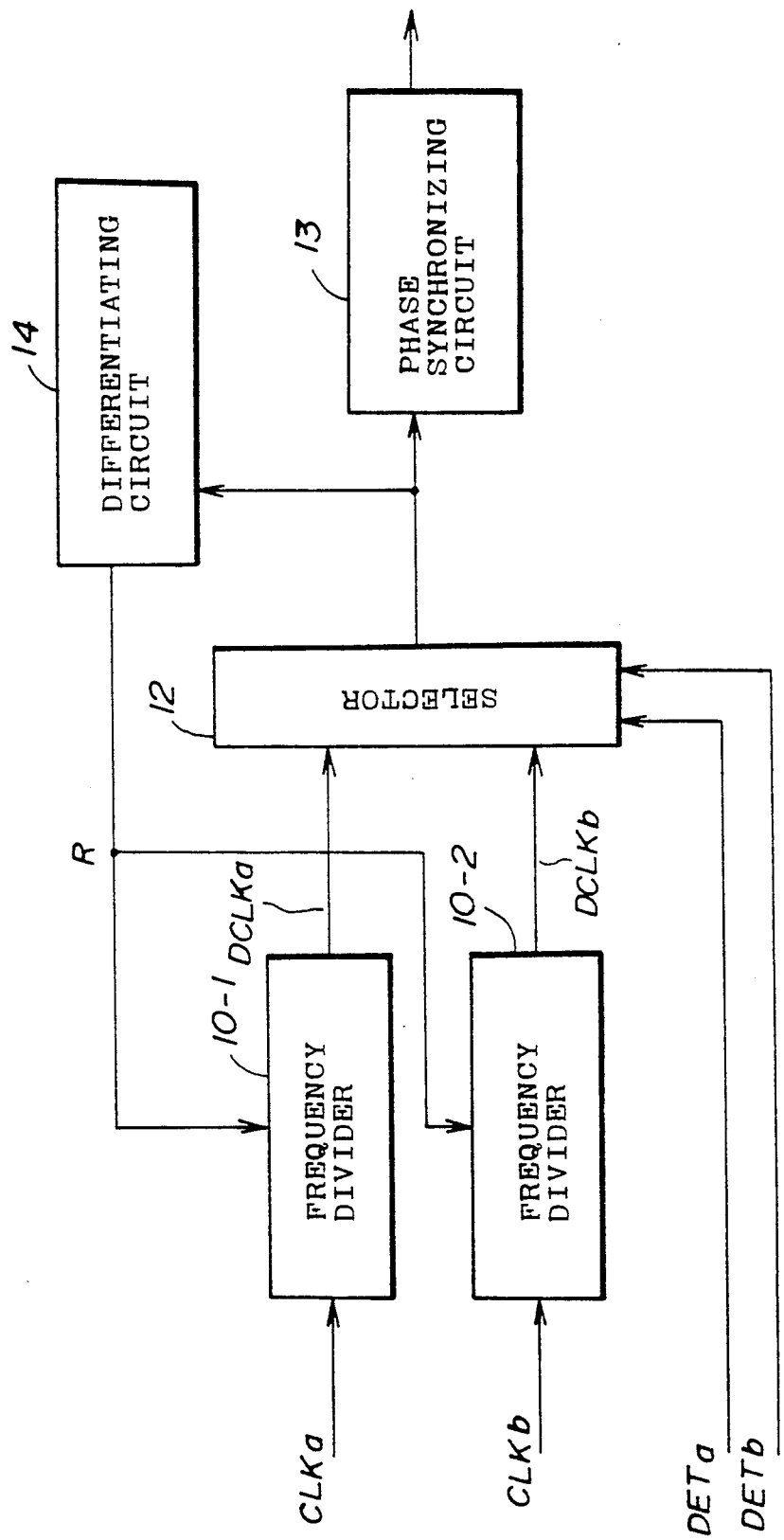
FIG. 1 is a block diagram of a conventional clock switching apparatus.
Figure 2:
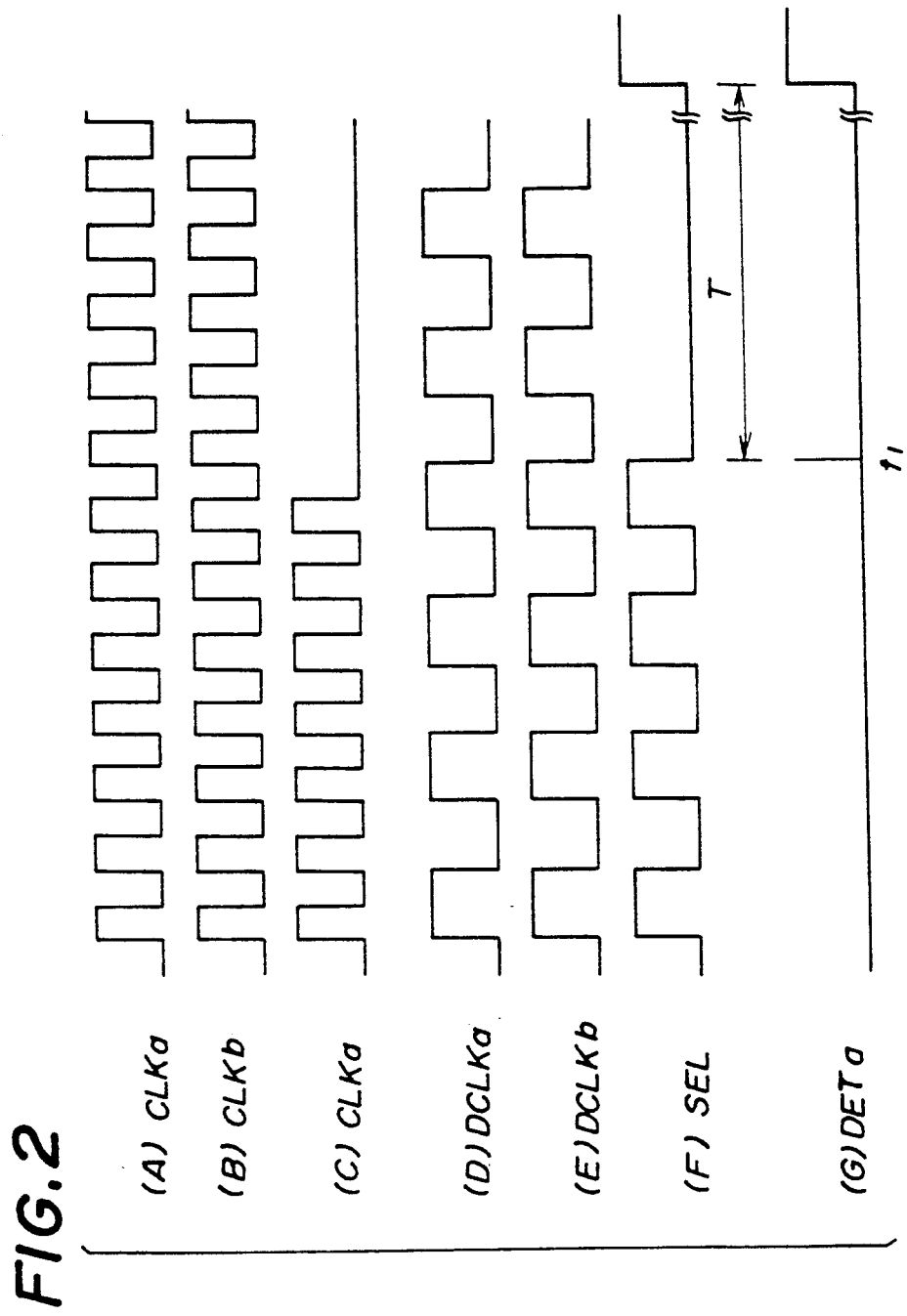
FIG. 2 is a waveform diagram illustrating the operation of the apparatus shown in FIG. 1 and a disadvantage thereof.

It will be noted that the selector 23 (which corresponds to the selector 12 shown in FIG. 1) switches the clock signals having frequencies higher than the frequencies of the frequency-divided clock signals output by the frequency dividers 21-1–21-n (which correspond to the frequency dividers 10-1 and 10-2 shown in FIG. 1). The clock generators (for example, phase-locked loop circuits) respectively provided in the phase synchronizing circuits 22-1–22-n are capable of continuously generating clock signals (although having small phase variations) in self-running operation even when the currently used frequency-divided clock signal is broken and is not being supplied during the period T necessary to determine whether or not the break of the clock signal has occurred. During this time, the built-in clock generator of the phase synchronizing unit related to the clock signal being broken, will continuously generate the clock signal having a frequency which makes it possible for the phase synchronizing circuit 25 to operate correctly. In other words, the phase synchronizing circuit 25 will continuously receive the divided clock signal having a frequency between upper and lower frequency limits thereof within which the phase synchronizing circuit 25 can synchronize the output clock signal generated therein with the divided clock signal from the frequency divider 24.

Figure 4:
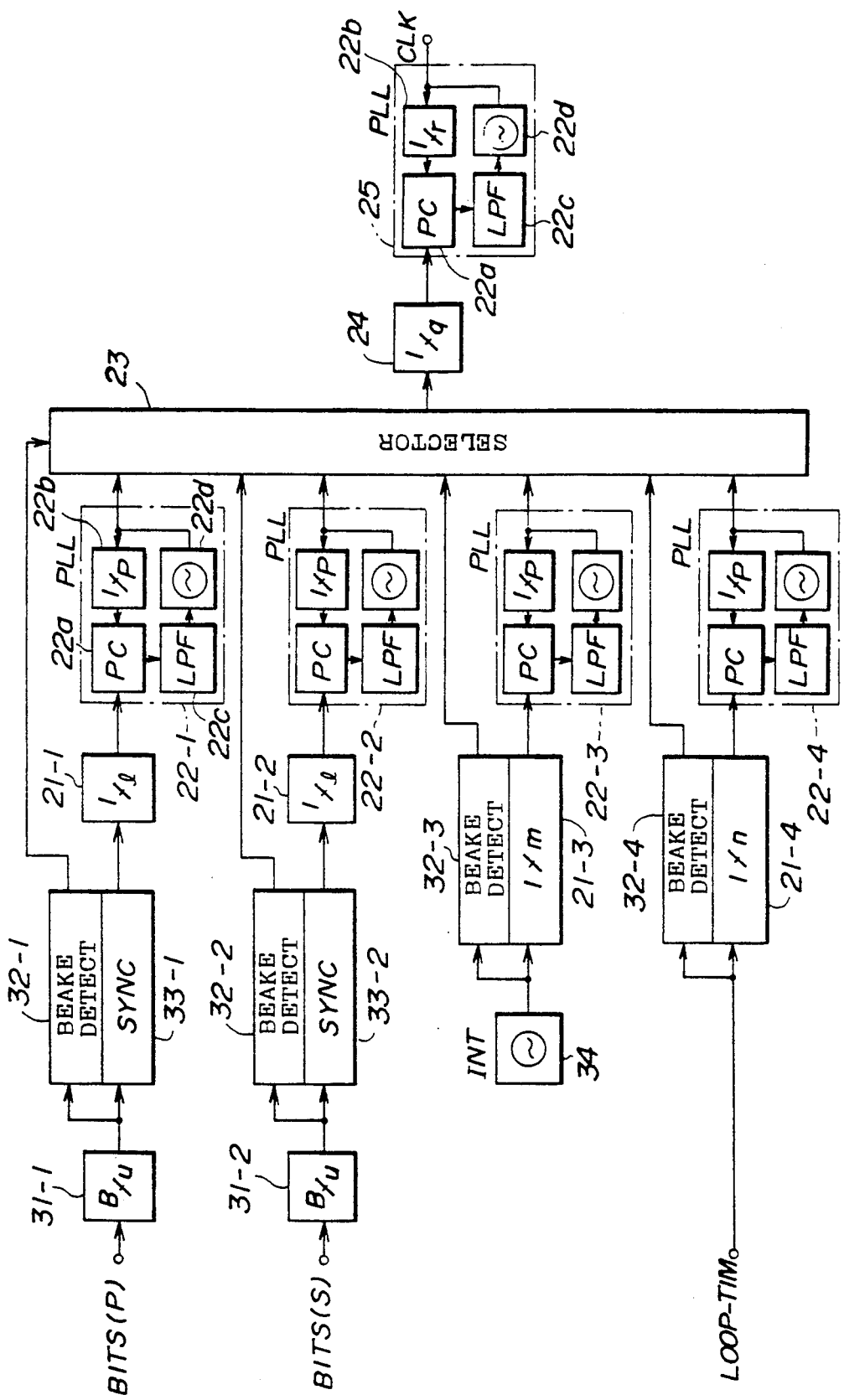
FIG. 4 is a block diagram of a preferred embodiment of the present invention.

FIG. 4 shows a preferred embodiment of the present invention where n (FIG. 3)=4. The clock switching apparatus shown in FIG. 4 handles a primary master clock signal BITS(P), a secondary master clock signal BITS(S), an internal clock signal INT generated by a local generator 34, and a clock signal LOOP-TIM extracted from a signal on a transmission line (not shown for the sake of simplicity). The primary and secondary master clock signals BITS(P) and BITS(S) are generated and output by a master clock generator in an office exchange (not shown).

Polarity changing circuits 31-1 and 31-2 change the bipolar master clock signals BITS(P) and BITS(P) to unipolar master clock signals, respectively. It will be noted that the bipolar characteristics are suitable for signal transmission. The unipolar master clock signals BITS(P) and BITS(S) output by the polarity changing circuits 31-1 and 31-2 are respectively input to synchronization detecting circuits 33-1 and 33-2 and signal break detection circuits 32-1 and 32-2. The synchronization circuits 33-1 and 33-2 synchronize the unipolar master clock signals BITS(P) and BITS(S) with each other. The signal break detection circuits 32-1 and 32-2 output detection signals to the selector 23 when the break of the master clock signals BITS(P) and BITS(S) is respectively detected.

Figure 5:
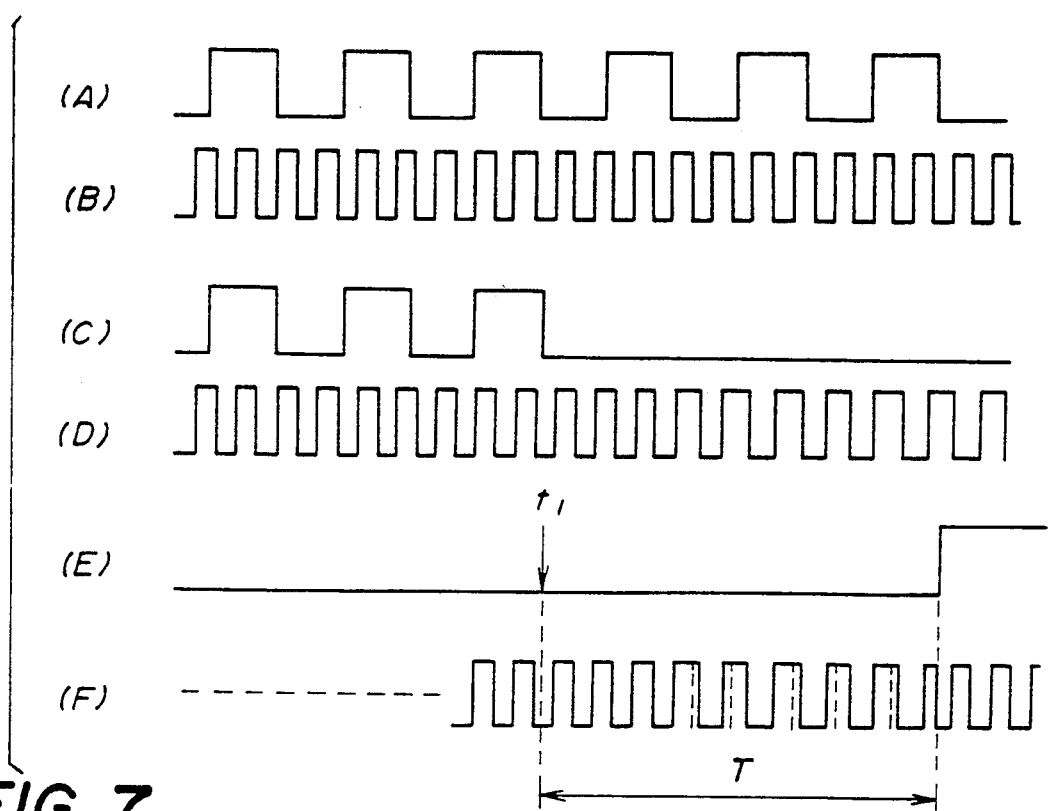
FIG. 5 is a waveform diagram showing the operation of the preferred embodiment of the present invention shown in FIG. 4.

Each of the frequency dividers 21-1 and 21-2 frequency-divides the master clock signal, and generates a divided clock signal having a frequency equal to, for example, 8 kHz, as shown in (A) of FIG. 5. The divided clock signals generated and output by the frequency dividers 21-1 and 21-2 are input to the phase synchronizing circuits 22-1 and 22-2, respectively. As shown in FIG. 4, each of the phase synchronizing circuits 22-1 and 22-2 is comprised of a PLL circuit, which is composed of a phase comparator (PC) 22a, a frequency divider (1/p) 22b, a lowpass filter (LPF) 22c and a clock generator 22d comprised of, for example, a voltage controlled oscillator. The clock generator 22d generates a clock signal having a frequency which is much higher than that of the divided clock signal output by the frequency divider 21-1. The frequency of the clock signal generated by the clock generator 22d is equal to 100 MHz. FIG. 5-(B) shows the clock signal generated by the clock generator 22d (it will be noted that the clock signal shown in (B) of FIG. 5 is expanded). The frequency divider 22b frequency-divides the clock signal generated by the clock generator 22d, and outputs to the phase comparator 22a a divided clock signal having the same frequency as the divided clock signal from the frequency divider 21-1. The phase comparator 22a compares the phase of the divided clock signal from the frequency divider 22b with the phase of the divided clock signal from the frequency divider 21-1, and outputs a voltage signal to the clock generator 22d via the lowpass filter 22c. In this way, the clock signal generated by the clock generator 22d is synchronized with the divided clock signal from the frequency divider 21-1. The phase synchronizing circuit 22-2 operates in the same way as the above-mentioned phase synchronizing circuit 22-1.

The internal clock signal generated by the internal clock generator 34 is input to a frequency divider 21-3 and a signal break detection circuit 32-3. The frequency divider 21-3 frequency-divides the internal clock signal and outputs a divided internal clock signal having a frequency of, for example, 8 kHz to the phase synchronizing circuit 22-3, which is configured in the same way as each of the phase synchronizing circuits 22-1 and 22-2. The signal break detection circuit 32-3 outputs a detection signal to the selector 23 when the break of the internal clock signal is detected. The extracted clock signal LOOP-TIM is processed by a signal break detection circuit 32-4, a frequency divider 21-4 and the PLL circuit 22-4 in the same way as described above. It will be noted that since the frequency of each of the clock signals INT and LOOP-TIM is different from each other and different from that of each of the master clock signals BITS(P) and BITS(S), the dividing rates of frequency of the frequency dividers 21-3 and 21-4 are different from each other and further different from that of each of the frequency dividers 21-1 and 21-2. In FIG. 4, the frequency dividing rates of the frequency dividers 21-1, 21-2, 21-3 and 21-4 are indicated as '1/1', '1/1', '1/m' and '1/n', respectively. The frequency dividing rate of the frequency divider 22b of each of the PLL circuits 22-1-22-4 is indicated as '1/p'.

The selector 23 selects one of the four input clock signals as follows. Normally, the selector 23 selects, for example, the clock signal related to the primary master clock signal BITS(P). When the primary master clock signal BITS(P) is broken, the selector 23 selects one of the other clock signals.

Figure 6:
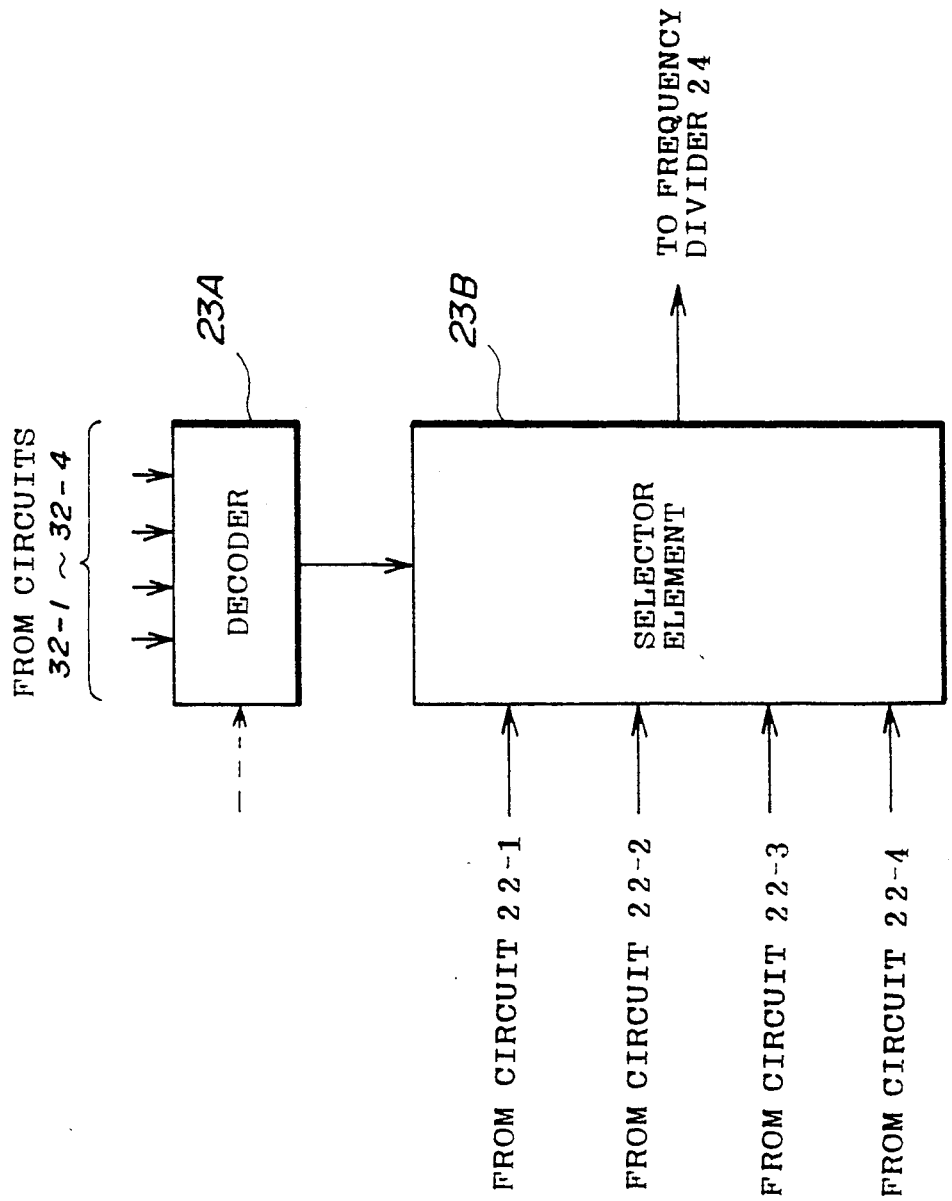
FIG. 6 is a block diagram of a selector shown in FIG. 4.

FIG. 6 is a block diagram of the selector 23, which is composed of a decoder 23A and a selector element 23B. The decoder 23A receives the detection signals from the circuits 32-1-32-4, and generates a select signal to the selector element 23B. Normally, the select signal specifies the selection of the clock signal from the PLL circuit 22-1. When the primary master clock signal BITS(P) is broken, the decoder 23A generates the select signal which indicates the selection of, for example, the clock signal related to the secondary clock signal BITS(S). It is possible to apply an external instruction signal indicating which clock signal should be sent to the decoder 23A.

Returning now to FIG. 4, the selected clock signal is frequency-divided by the frequency divider 24 having a frequency dividing rate '1/q'. A divided clock signal output by the frequency divider 24 is input to the phase synchronizing circuit 25 formed of a PLL circuit, which has the same circuit configuration as that of each of the phase synchronizing circuits 22-1-22-4. The clock generator 22d of the PLL circuit 25 generates an output clock signal CLK, which is frequency-divided by the frequency divider 22b (having a frequency dividing rate '1/r' different from that of each of the circuits 22-1-22-4). The phase comparator 22a compares the phase of the divided clock signal from frequency divider 22d of the PLL circuit 25, with the phase of the frequency-divided signal from the frequency divider 24, and outputs a voltage signal corresponding to a phase difference to the clock generator 22d. In this way, the output clock signal having the same phase as that of the selected clock signal can be obtained.

Assuming now that the primary master clock BITS(P) being selected is broken at time $t_1$ as shown in (C) of FIG. 5, the divided clock signal generated and output by the frequency divider 21-1 is stopped and maintained at a low level, as shown in (E) of FIG. 5. Thus, the PLL circuit 22-1 continuously receives the low-level clock signal from time $t_1$. As a result, the phase difference detected by the phase comparator 22a of the PLL circuit 22-1 increases. However, as shown in (D) of FIG. 5, the PLL circuit 22-1 continuously generates the clock signal even though it has an increasing phase error, as more definitely shown in (F) of FIG. 5, in which broken lines show the correct phase positions of the clock signal generated by the PLL circuit 22-1.

Figure 7:
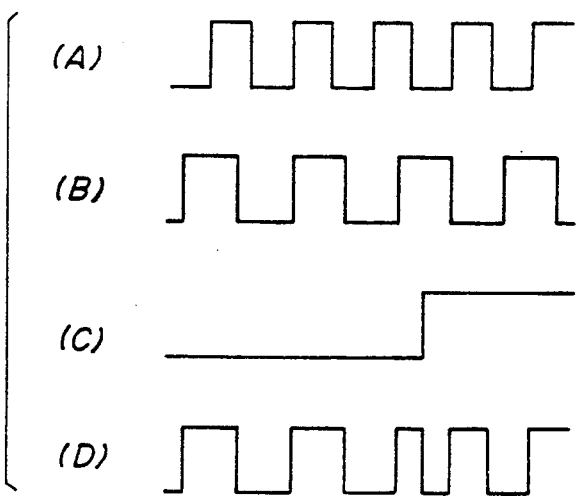
FIG. 7 is a waveform diagram showing the operation of the preferred embodiment of the present invention shown in FIG. 4.

The detection signal output by the signal break detection circuit 32-1 changes to the high (active) level after the period T from time $t_1$. This detection signal is also illustrated in (C) of FIG. 7. FIG. 7-(A) shows the clock signal generated by the clock generator 22d of each of the PLL circuits 22-1-22-4 when it does not have any phase error. FIG. 7-(B) shows the clock signal generated by the clock generator 22d of the PLL circuit 22-1 when it has a phase error as shown in (F) of FIG. 5. In response to the level change in the detection signal from the signal break detection circuit 32-1, the selector 23 switches the selection of the clock signal shown in (B) of FIG. 7 to the selection of the clock signal shown in (A) of FIG. 7. Thus, the selected clock signal has a waveform as shown in (D) of FIG. 7.

The selected clock signal shown in (D) of FIG. 7 is frequency-divided by the frequency divider 24 and the divided clock signal is input to the PLL circuit 25. It should be noted that the phase error shown in (D) of FIG. 7 is within one cycle of the clock signal (equal to, for example, 100 MHz). Thus, the PLL circuit 25 can compensate for such a small phase variation. Thus, it is possible to continuously supply the output clock signal to the next-stage circuit without large phase variations.

The present invention is not limited to the specifically disclosed embodiment, and variations and modifications may be made without departing from the scope of the present invention.

What is claimed is:

1. A clock switching apparatus comprising:
   first phase synchronizing means for receiving n (n is an integer) input clock signals and for generating n first clock signals respectively related to said n input clock signals, each of said n first clock signals having a frequency higher than that of a corresponding one of said n input clock signals;
   selector means, coupled to said first phase synchronizing means, for selecting one of the n first clock signals;
   first frequency dividing means, coupled to said selector means, for generating a second clock signal obtained by frequency-dividing said one of the n first clock signals selected by said selector means; and
   second phase synchronizing means, coupled to said first frequency dividing means, for generating an output clock signal synchronized with said second clock signal.

2. A clock switching apparatus as claimed in claim 1, wherein said first phase synchronizing means comprises n PLL circuits respectively related to said n input clock signals, and
   wherein each of said n PLL circuits comprises:
   a generator generating one of said n first clock signals;
   a frequency divider generating a frequency-divided clock signal by frequency-dividing said one of the n first clock signals generated by said generator; and
   a phase comparator comparing the phase of one of the n input clock signals with the phase of said frequency-divided clock signal and for controlling said generator so that a phase difference therebetween is zero.

3. A clock switching apparatus as claimed in claim 1, wherein said second phase synchronizing means comprises:
   a generator generating said output clock signal;
   a frequency divider generating a frequency-divided clock signal by frequency-dividing said output clock signal; and
   a phase comparator comparing the phase of said frequency-divided clock signal with the phase of said second clock signal generated by said first frequency dividing means and for controlling said generator so that a phase difference therebetween is zero.

4. A clock switching apparatus as claimed in claim 1, further comprising signal break detecting means for detecting a signal break of each of said n input clock signals and for controlling said selector on the basis of results of detecting the signal break.

5. A clock switching apparatus as claimed in claim 1, further comprising signal break detecting means for detecting a signal break of each of said n input clock signals and for outputting detection signals showing results of detecting the signal break to said selector means,
wherein said selector means comprises means for indicating which one of said n first clock signals should be selected.

6. A clock switching apparatus as claimed in claim 1, further comprising second frequency dividing means for frequency-dividing a master clock signal supplied from an external device and for generating at least one of said n input clock signals from said master clock signal.

7. A clock switching apparatus as claimed in claim 1, further comprising internal clock signal generating means for generating an internal clock signal which is one of said n input clock signals.

8. A clock switching apparatus as claimed in claim 1, further comprising second frequency dividing means for frequency-dividing an extracted clock signal supplied from an external device and for generating at least one of said n input clock signals from said extracted clock signal.

9. A clock switching apparatus as claimed in claim 2, wherein said frequency-divided clock signal has a frequency equal to that of a corresponding one of said n input clock signals.

10. A clock switching apparatus as claimed in claim 3, wherein said frequency-divided clock signal has a frequency equal to that of said second clock signal.

* * * * *